US007782055B2

(12) United States Patent
Kanda

(10) Patent No.: US 7,782,055 B2
(45) Date of Patent: Aug. 24, 2010

(54) MRI APPARATUS COMBINING DIFFUSION WEIGHTED IMAGING AND DIFFUSION TENSOR IMAGING OF ONE OR MORE SLICES FOR EFFICIENT SELECTIVE SUBSTITUTION AND EXTRACTION

(75) Inventor: Kenichi Kanda, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 278 days.

(21) Appl. No.: 12/021,034

(22) Filed: Jan. 28, 2008

(65) Prior Publication Data

US 2008/0180097 A1 Jul. 31, 2008

(30) Foreign Application Priority Data

Jan. 30, 2007 (JP) ............................. 2007-018712

(51) Int. Cl.
*G01V 3/00* (2006.01)
(52) U.S. Cl. ........................................ 324/309; 324/307
(58) Field of Classification Search ......... 324/300–322, 324/76.21; 600/407–435; 702/19; 382/128–131; 367/42; 379/285
See application file for complete search history.

(56) References Cited

U.S. PATENT DOCUMENTS

| 2,805,286 | A | * | 9/1957 | Baker ........................ 379/285 |
| 3,011,582 | A | * | 12/1961 | Peterson ...................... 367/42 |
| 3,182,256 | A | * | 5/1965 | Andrew ..................... 324/76.21 |
| 6,522,324 | B1 | | 2/2003 | Bosma et al. |
| 6,526,305 | B1 | | 2/2003 | Mori |
| 6,724,190 | B2 | | 4/2004 | van Muiswinkel et al. |
| 6,969,991 | B2 | * | 11/2005 | Bammer et al. ............. 324/307 |
| 7,078,897 | B2 | | 7/2006 | Yablonskiy et al. |
| 7,633,291 | B2 | * | 12/2009 | Zwanger ..................... 324/309 |
| 7,672,790 | B2 | * | 3/2010 | McGraw et al. ............... 702/19 |
| 2007/0167732 | A1 | * | 7/2007 | Zwanger ..................... 600/410 |
| 2008/0122440 | A1 | * | 5/2008 | Sakai et al. .................. 324/309 |
| 2008/0180097 | A1 | * | 7/2008 | Kanda ........................ 324/307 |
| 2009/0005678 | A1 | * | 1/2009 | Schmiedehausen et al. . 600/427 |
| 2009/0290770 | A1 | * | 11/2009 | Mori et al. .................. 382/128 |

FOREIGN PATENT DOCUMENTS

| JP | 09-070397 | 3/1997 |
| JP | 2005-052508 | 3/2005 |

* cited by examiner

*Primary Examiner*—Brij B. Shrivastav
*Assistant Examiner*—Tiffany A Fetzner
(74) *Attorney, Agent, or Firm*—Armstrong Teasdale LLP

(57) ABSTRACT

An MRI apparatus includes: an image display device for displaying diffusion weighted images of respective axes corresponding to one slice; a designation operating device for allowing an operator to designate each diffusion weighted image targeted for rephotograph from the displayed diffusion weighted images of axes; a diffusion weighted imaging device for rephotographing only the axis of each diffusion weighted image designated by the operator; a diffusion weighted image substituting device for substituting an original diffusion weighted image with each diffusion weighted image obtained at the diffusion weighted photography; and a diffusion tensor image creating device for creating a diffusion tensor image from a set of the post-substitution diffusion weighted images.

20 Claims, 6 Drawing Sheets

FIG. 5

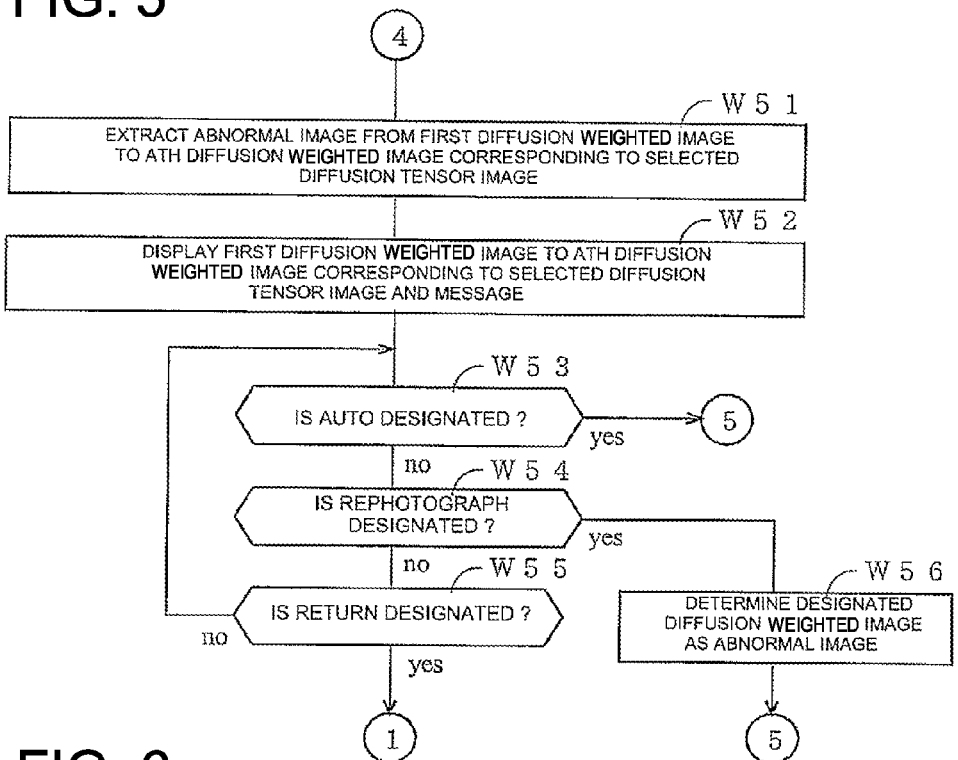

FIG. 6

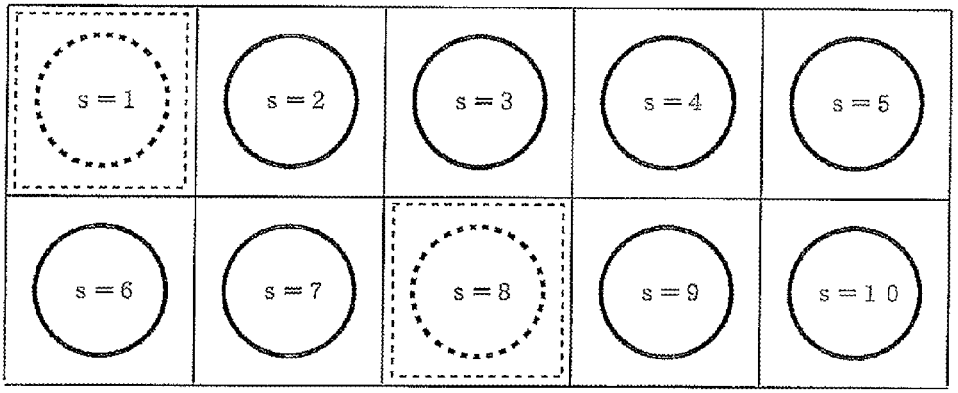

THERE IS A POSSIBILITY OF IMAGES WITH FRAMES BEING ABNORMAL IMAGES.

WHEN PERFORMING REPHOTOGRAPH OF IMAGE BY LEAVING THE REPHOTOGRAPH TO APPARATUS WITHOUT MANUALLY SELECTING THE IMAGE, CLICK "FULL-AUTO"  |FULL AUTO|

WHEN THERE IS AN IMAGE TO BE REPHOTOGRAPHED BY MANUAL SELECTION, CLICK "SEMI-AUTO" AFTER MANUAL SELECTION THEREOF  |SEMI-AUTO|

WHEN IT IS DESIRED TO SEE DIFFUSION WEIGHTED IMAGES OF RESPECTIVE AXES AS IMAGES, CLICK "RESPECTIVE-AXES DISPLAY" AFTER MANUAL SELECTION THEREOF  |RESPECTIVE-AXES DISPALY|

WHEN PROCESSING IS TERMINATED, CLICK "END"  |END|

FIG. 7

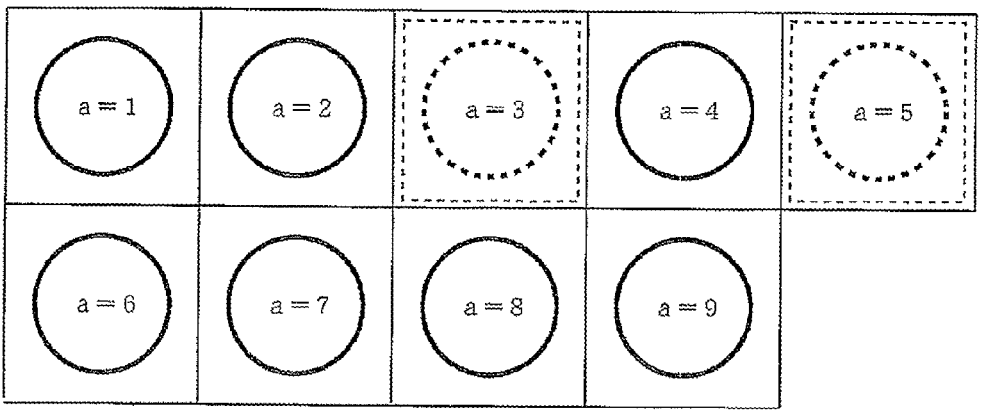

THERE IS A POSSIBILITY OF IMAGES WITH FRAMES BEING ABNORMAL IMAGES.

WHEN REPHOTOGRAPH IS TAKEN WITH BEING LEFT TO APPARATUS, CLICK "AUTO"  [AUTO]

WHEN ABNORMAL IMAGES ARE DESIGNATED AND REPHOTOGRAPH THEREOF ARE TAKEN, CLICK "REPHOTOGRAPH" AFTER ALL ABNORMAL IMAGES ARE CLICKED AND DESIGNATED  [REPHOTOGRAPH]

WHEN IT IS DESIRED TO RETURN TO DISPLAY OF THREE-DIMENSIONAL DIFFUSION TENSOR IMAGES, CLICK "RETURN"  [RETURN]

FIG. 8

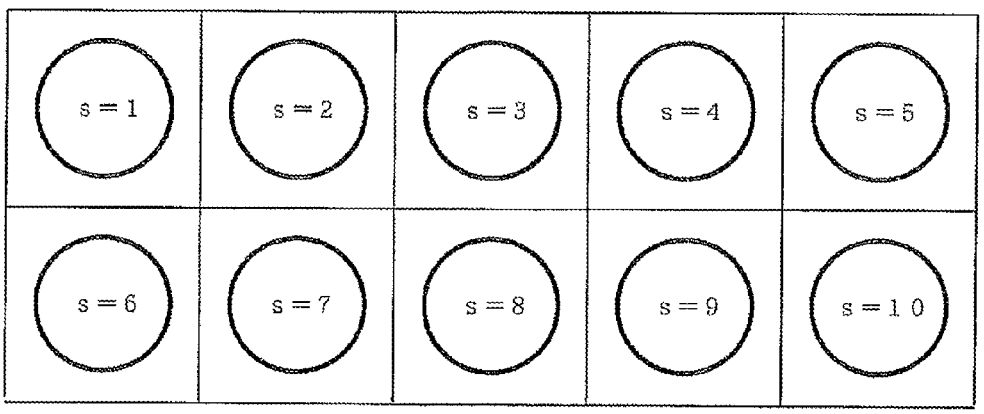

NO ABNORMAL IMAGES WERE DETECTED

WHEN THERE IS AN IMAGE TO BE REPHOTOGRAPHED BY MANUAL SELECTION, CLICK "SEMI-AUTO" AFTER MANUAL SELECTION THEREOF  [SEMI-AUTO]

WHEN IT IS DESIRED TO SEE DIFFUSION WEIGHTED IMAGES OF RESPECTIVE AXES AS IMAGES, CLICK "RESPECTIVE-AXES DISPLAY" AFTER MANUAL SELECTION THEREOF  [RESPECTIVE-AXES DISPLAY]

WHEN PROCESSING IS TERMINATED, CLICK "END"  [END]

MRI APPARATUS COMBINING DIFFUSION WEIGHTED IMAGING AND DIFFUSION TENSOR IMAGING OF ONE OR MORE SLICES FOR EFFICIENT SELECTIVE SUBSTITUTION AND EXTRACTION

CROSS REFERENCE TO RELATED APPLICATIONS

This application claims the benefit of Japanese Patent Application No. 2007-018712 filed Jan. 30, 2007.

BACKGROUND OF THE INVENTION

The present invention relates to an MRI (Magnetic Resonance Imaging) apparatus, and more particularly to an MRI apparatus capable of recreating a diffusion tensor image in a short period of time where an abnormal image exists.

There has heretofore been known an MRI apparatus which obtains sets of diffusion weighted images of six or more axes by photography or imaging and creates an intended diffusion tensor image from the sets of the diffusion weighted images (refer to, for example, patent documents 1 and 2).

Patent Document 1. Japanese Unexamined Patent Application Publication No. 2005-525208.

Patent Document 2. Japanese Unexamined Patent Publication No. Hei 9(1997)-70397.

When a diffusion tensor image is created from sets of diffusion weighted images of nine axes, for example, imaging or photography free of application of an MPG (Motion Probing Gradient) is done once and the MPG is applied to the nine axes respectively, and their imaging is done to obtain the sets of diffusion weighted images of the nine axes. Therefore, it is necessary to carry out photographs of 10 times (=1+9) as a whole.

On the other hand, since the diffusion weighted imaging or photography executed by application of the MPG is sensitive to motion, the diffusion weighted image might be an improper abnormal image due to fine motion of a subject. A diffusion tensor image created from a set of diffusion weighted images including the abnormal image might also be an improper abnormal image.

In the conventional MRI apparatus, the diffusion weighted imaging about all axes was redone even when the abnormal image occurred in one axis. That is, when the diffusion tensor image is created from the sets of the diffusion weighted images of the nine axes as in the example referred to above, the diffusion tensor image has been recreated based on the diffusion weighted images obtained by retrying ten photographs.

Under such circumstances, however, a problem arises in that it results in a reduction in detection efficiency.

SUMMARY OF THE INVENTION

It is desirable that a problem described previously is solved.

In a first aspect, the invention provides an MRI apparatus including an image display device for displaying diffusion weighted images of respective axes corresponding to one slice, a designation operating device for allowing an operator to designate each diffusion weighted image targeted for rephotograph from the displayed diffusion weighted images of axes, a diffusion weighted imaging device for rephotographing only the axis of each diffusion weighted image designated by the operator, a diffusion weighted image substituting device for substituting an original diffusion weighted image with each diffusion weighted image obtained at the diffusion weighted photography, and a diffusion tensor image creating device for creating a diffusion tensor image from a set of the post-substitution diffusion weighted images.

In the MRI apparatus according to the first aspect, when an abnormal image exists, only the axis of a diffusion weighted image designated by the operator is rephotographed without retrying diffusion weighted imaging about all axes. When an abnormal image occurs in one axis, for example, the diffusion weighted imaging is retried only once only with respect to the one axis. That is, even when the abnormal image occurs in one axis as in the aforementioned example of the 9-axis diffusion weighted imaging, such wastage that the ten photographs are retried, can be avoided, and hence detection efficiency can be improved.

In a second aspect, the invention provides an MRI apparatus wherein in the MRI apparatus according to the first aspect, an abnormal image extracting device for extracting an abnormal image from the diffusion weighted images of the respective axes corresponding to the one slice, and a warning device for notifying the presence of the abnormal image to the operator are provided.

In the MRI apparatus according to the second aspect, when an abnormal image exists, the abnormal image is automatically extracted and the MRI apparatus warns the operator of its presence. It is therefore possible to reduce a burden on the operator.

In a third aspect, the invention provides an MRI apparatus wherein in the MRI apparatus according to the second aspect, the abnormal image extracting device extracts an abnormal image on the basis of the average of pixel values of the diffusion weighted images.

In the MRI apparatus according to the third aspect, since the average of the pixel values of the diffusion weighted images becomes a value away from a normal image in the case of the abnormal image, the abnormal image can be extracted based on it.

In a fourth aspect, the invention provides an MRI apparatus wherein in the MRI apparatus according to any of the first through third aspects, an imaging condition storing device for storing imaging conditions for the diffusion weighted images of the respective axes therein is provided and the diffusion weighted imaging device reads an imaging condition for the diffusion weighted image designated by the operator and performs rephotograph under the read imaging condition.

In the MRI apparatus according to the fourth aspect, the diffusion weighted imaging can be retried accurately and under the same imaging condition because the imaging conditions for the diffusion weighted images of the respective axes are stored. It is possible to save the trouble of resetting the imaging condition. Hence a burden on the operator can be reduced.

In a fifth aspect, the invention provides an MRI apparatus including an abnormal image extracting device for extracting an abnormal image from diffusion weighted images of respective axes corresponding to one slice, a diffusion weighted imaging device for rephotographing only the axis of each extracted diffusion weighted image, a diffusion weighted image substituting device for substituting an original diffusion weighted image with each diffusion weighted image obtained at the diffusion weighted photography, and a diffusion tensor image creating device for creating a diffusion tensor image from a set of the post-substitution diffusion weighted images.

In the MRI apparatus according to the fifth aspect, when an abnormal image exists, only the axis of the abnormal image is rephotographed without retrying diffusion weighted imaging about all axes. When an abnormal image occurs in one axis, for example, the diffusion weighted imaging is retried only once only with respect to the one axis. That is, even when the abnormal image occurs in one axis as in the aforementioned example of the 9-axis diffusion weighted imaging, such wastage that the ten photographs are retried, can be avoided, and hence detection efficiency can be improved.

Further, since the abnormal image is automatically extracted and imaging thereof is redone, a burden on an operator can be reduced.

In a sixth aspect, the invention provides an MRI apparatus wherein in the MRI apparatus according to the fifth aspect, the abnormal image extracting device extracts an abnormal image, based on the average of pixel values of the diffusion weighted images.

In the MRI apparatus according to the sixth aspect, since the average of the pixel values of the diffusion weighted images becomes a value away from a normal image in the case of the abnormal image, the abnormal image can be extracted based on it.

In a seventh aspect, the invention provides an MRI apparatus wherein in the MRI apparatus according to the fifth or sixth aspect, an imaging condition storing device for storing imaging conditions for the diffusion weighted images of the respective axes therein is provided, and the diffusion weighted imaging device reads an imaging condition for each extracted diffusion weighted image and performs rephotograph under the read imaging condition.

In the MRI apparatus according to the seventh aspect, the diffusion weighted imaging can be retried accurately and under the same imaging condition because the imaging conditions for the diffusion weighted images of the respective axes are stored.

In an eighth aspect, the invention provides an MRI apparatus including selection operating device for allowing an operator to select a diffusion tensor image targeted for rephotograph from diffusion tensor images of one or more slices, an image display device for displaying diffusion weighted images of respective axes corresponding to the diffusion tensor image selected by the operator, a designation operating device for allowing the operator to designate a diffusion weighted image targeted for rephotograph from the displayed diffusion weighted images of axes, diffusion weighted imaging device for rephotographing only the axis of the diffusion weighted image designated by the operator, a diffusion weighted image substituting device for substituting an original diffusion weighted image with each diffusion weighted image obtained at the diffusion weighted photography, a diffusion tensor image creating device for creating a diffusion tensor image from a set of the post-substitution diffusion weighted images, and a diffusion tensor image substituting device for substituting an original diffusion tensor image with the created diffusion tensor image.

In the MRI apparatus according to the eighth aspect, when an abnormal image exists, only the axis of the diffusion weighted image designated by the operator is rephotographed without retrying diffusion weighted imaging about all axes. When an abnormal image occurs in one axis, for example, the diffusion weighted imaging is retried only once only with respect to the one axis. That is, even when the abnormal image occurs in one axis as in the aforementioned example of the 9-axis diffusion weighted imaging, such wastage that the ten photographs are retried, can be avoided, and hence detection efficiency can be improved.

In a ninth aspect, the invention provides an MRI apparatus wherein in the MRI apparatus according to the eighth aspect, an abnormal image extracting device for extracting an abnormal image from the diffusion tensor images of the one or more slices, and a warning device for notifying the presence of the abnormal image to the operator are provided.

In the MRI apparatus according to the ninth aspect, when an abnormal image exists in the diffusion tensor images, the abnormal image is automatically extracted and the MRI apparatus warns the operator of its presence. It is therefore possible to reduce a burden on the operator.

In a tenth aspect, the invention provides an MRI apparatus wherein in the MRI apparatus according to the ninth aspect, the abnormal image extracting device extracts an abnormal image on the basis of the average of pixel values of the diffusion tensor images.

In the MRI apparatus according to the tenth aspect, since the average of the pixel values of the diffusion weighted images becomes a value away from a normal image in the case of the abnormal image, the abnormal image can be extracted based on it.

In an eleventh aspect, the invention provides an MRI apparatus wherein in the MRI apparatus according to either of the ninth and tenth aspects, an abnormal image extracting device for extracting an abnormal image from the diffusion weighted images of the respective axes corresponding to the diffusion tensor image selected by the operator, and a warning device for notifying the presence of the extracted diffusion weighted image to the operator are provided.

In the MRI apparatus according to the eleventh aspect, when an abnormal image exists in the diffusion tensor images of the respective axes, the abnormal image is automatically extracted and the MRI apparatus warns the operator of its presence. It is therefore possible to reduce a burden on the operator.

In a twelfth aspect, the invention provides an MRI apparatus wherein in the MRI apparatus according to the eleventh aspect, the abnormal image extracting device extracts an abnormal image, based on the average of pixel values of the diffusion weighted images.

In the MRI apparatus according to the twelfth aspect, since the average of the pixel values of the diffusion weighted images becomes a value away from a normal image in the case of the abnormal image, the abnormal image can be extracted based on it.

In a thirteenth aspect, the invention provides an MRI apparatus wherein in the MRI apparatus according to any of the eighth through twelfth aspects, an imaging condition storing device for storing imaging conditions for the diffusion weighted images of the respective axes therein is provided, and the diffusion weighted imaging device reads an imaging condition for the diffusion weighted image designated by the operator and performs rephotograph under the read imaging condition.

In the MRI apparatus according to the thirteenth aspect, the diffusion weighted imaging can be retried accurately and under the same imaging condition because the imaging conditions for the diffusion weighted images of the respective axes are stored. It is possible to save the trouble of resetting the imaging condition. Hence a burden on the operator can be reduced.

In a fourteenth aspect, the invention provides an MRI apparatus including a selection operating device for allowing an operator to select a diffusion tensor image targeted for rephotograph from diffusion tensor images of one or more slices, an abnormal image extracting device for extracting an abnormal image from diffusion weighted images of respective axes corresponding to the diffusion tensor image selected by the operator, a diffusion weighted imaging device for rephotographing only the axis of the extracted diffusion weighted image, a diffusion weighted image substituting device for substituting an original diffusion weighted image with each diffusion weighted image obtained at the diffusion weighted photography, a diffusion tensor image creating device for creating a diffusion tensor image from a set of the post-substitution diffusion weighted images, and a diffusion tensor image substituting device for substituting an original diffusion tensor image with the created diffusion tensor image.

In the MRI apparatus according to the fourteenth aspect, when an abnormal image exists, only the axis of the diffusion weighted image designated by the operator is rephotographed without retrying diffusion weighted imaging about all axes. When an abnormal image occurs in one axis, for example, the diffusion weighted imaging is retried only once only with respect to the one axis. That is, even when the abnormal image occurs in one axis as in the aforementioned example of the 9-axis diffusion weighted imaging, such wastage that the ten photographs are retried, can be avoided, and hence detection efficiency can be improved.

If the operator selects a diffusion tensor image targeted for rephotography, then an abnormal image is automatically extracted and rephotographed. It is therefore possible to reduce a burden on the operator.

In a fifteenth aspect, the invention provides an MRI apparatus wherein in the MRI apparatus according to the fourteenth aspect, the abnormal image extracting device extracts an abnormal image, based on the average of pixel values of the diffusion weighted images.

In the MRI apparatus according to the fifteenth aspect, since the average of the pixel values of the diffusion weighted images becomes a value away from a normal image in the case of the abnormal image, the abnormal image can be extracted based on it.

In a sixteenth aspect, the invention provides an MRI apparatus wherein in the MRI apparatus according to the fourteenth or fifteenth aspect, an imaging condition storing device for storing imaging conditions for the diffusion weighted images of the respective axes therein is provided, and the diffusion weighted imaging device reads an imaging condition for each extracted diffusion weighted image and performs rephotograph under the read imaging condition.

In the MRI apparatus according to the sixteenth aspect, the diffusion weighted imaging can be retried accurately and under the same imaging condition because the imaging conditions for the diffusion weighted images of the respective axes are stored. It is possible to save the trouble of resetting the imaging condition. Hence a burden on the operator can be reduced.

In a seventeenth aspect, the invention provides an MRI apparatus including an abnormal image extracting device for extracting an abnormal image from diffusion tensor images of one or more slices and extracting an abnormal image from diffusion weighted images of respective axes corresponding to the extracted abnormal image, a diffusion weighted imaging device for rephotographing only the axis of the extracted diffusion weighted image, a diffusion weighted image substituting device for substituting an original diffusion weighted image with each diffusion weighted image obtained at the diffusion weighted photography, a diffusion tensor image creating device for creating a diffusion tensor image from a set of the post-substitution diffusion weighted images, and a diffusion tensor image substituting device for substituting an original diffusion tensor image with the created diffusion tensor image.

In the MRI apparatus according to the seventeenth aspect, when an abnormal image exists, only the axis of the abnormal image is rephotographed without retrying diffusion weighted imaging about all axes. When an abnormal image occurs in one axis, for example, the diffusion weighted imaging is retried only once only with respect to the one axis. That is, even when the abnormal image occurs in one axis as in the aforementioned example of the 9-axis diffusion weighted imaging, such wastage that the ten photographs are retried, can be avoided, and hence detection efficiency can be improved.

Further, since the abnormal image is automatically extracted and imaging thereof is retried, a burden on an operator can be reduced.

In an eighteenth aspect, the invention provides an MRI apparatus wherein in the MRI apparatus according to the seventeenth aspect, the abnormal image extracting device extracts an abnormal image, based on the averages of pixel values of both the diffusion tensor images and the diffusion weighted images.

In the MRI apparatus according to the eighteenth aspect, since the averages of the pixel values of both the diffusion tensor images and the diffusion weighted images become a value away from a normal image in the case of the abnormal image, the abnormal image can be extracted based on it.

In a nineteenth aspect, the invention provides an MRI apparatus wherein in the MRI apparatus according to the seventeenth or eighteenth aspect, an imaging condition storing device for storing imaging conditions for the diffusion weighted images of the respective axes therein is provided, and the diffusion weighted imaging device reads an imaging condition for each extracted diffusion weighted image and performs rephotograph under the read imaging condition.

In the MRI apparatus according to the nineteenth aspect, the diffusion weighted imaging can be retried accurately and under the same imaging condition because the imaging conditions for the diffusion weighted images of the respective axes are stored. It is possible to save the trouble of resetting the imaging condition. Hence a burden on the operator can be reduced.

According to the MRI apparatus of the invention, when an abnormal image exists, only the axis of the abnormal image is rephotographed without retrying diffusion weighted imaging about all axes. It is therefore possible to retry the diffusion weighted imaging in a short period of time and recreate a diffusion tensor image. Thus, detection efficiency can be enhanced.

The MRI apparatus of the invention is available for diffusion weighted imaging and diffusion tensor imaging.

Further objects and advantages of the present invention will be apparent from the following description of the preferred embodiments of the invention as illustrated in the accompanying drawings.

BRIEF DESCRIPTION OF THE DRAWINGS

FIG. 5 is a flowchart following FIG. 3.

FIG. 6 is a diagram illustrative of a display screen of diffusion tensor images.

FIG. 7 is a diagram illustrative of a display screen of diffusion weighted images.

FIG. 8 is a diagram illustrative of a display screen of diffusion tensor images

DETAILED DESCRIPTION OF THE INVENTION

Figure 1:
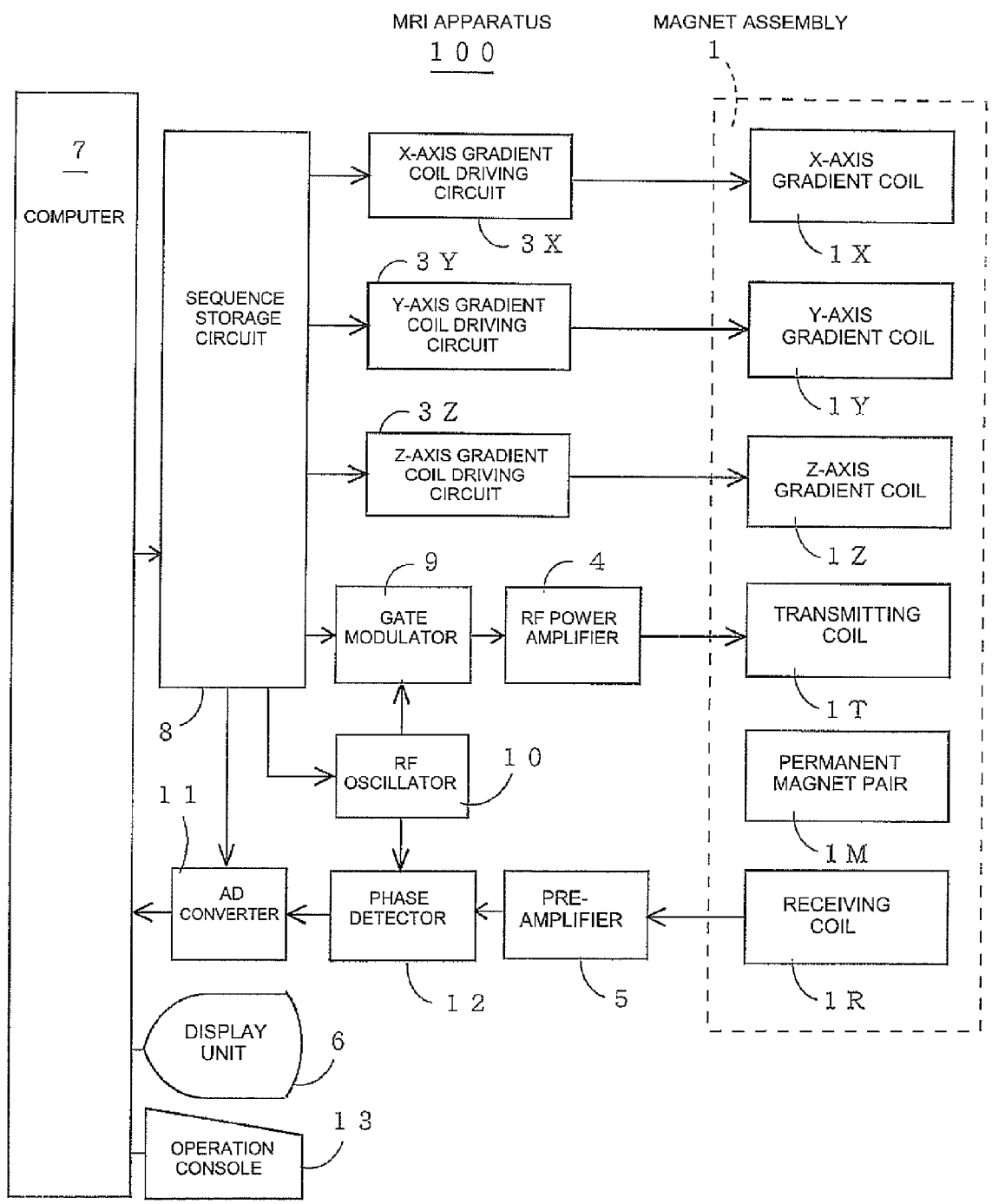
FIG. 1 is a block diagram showing a function configuration of an MRI apparatus according to a first embodiment.

The invention will be explained below in more detail in accordance with an embodiment illustrated in the drawings. Incidentally, the invention is not limited to or by it.

First Embodiment

FIG. 1 is a block diagram showing a function configuration of an MRI apparatus 100 according to a first embodiment.

In the present MRI apparatus 100, a magnet assembly 1 has a spatial portion (bore) for inserting a subject thereinside, and is equipped with an X-axis gradient coil 1X for forming an X-axis gradient magnetic field, a Y-axis gradient coil 1Y for forming a Y-axis gradient magnetic field, a Z-axis gradient coil 1Z for forming a Z-axis gradient magnetic field, a transmitting coil 1T for applying each RF pulse for exciting the spin of a nucleus in the subject, a receiving coil 1R for detecting an NMR signal from the subject, and a permanent magnet pair 1M for forming a static magnetic field, so as to surround the spatial portion.

A superconducting magnet may be used in place of the permanent magnet pair 1M.

The X-axis gradient coil 1X is connected to an X-axis gradient coil driving circuit 3X. The Y-axis gradient coil 1Y is connected to a Y-axis gradient coil driving circuit 3Y. The Z-axis gradient coil 1Z is connected to a Z-axis gradient coil driving circuit 3Z. The transmitting coil 1T is connected to an RF power amplifier 4.

The X-axis gradient coil driving circuit 3X includes an X-axis gradient amplifier. The Y-axis gradient coil driving circuit 3Y includes a Y-axis gradient amplifier. The Z-axis gradient coil driving circuit 3Z includes a Z-axis gradient amplifier. The RF power amplifier 4 includes an RF amplifier.

A sequence storage circuit 8 controls or operates the gradient coil driving circuits 3X, 3Y and 3Z, based on a pulse sequence stored therein in accordance with a command issued from a computer 7 to thereby generate gradient magnetic fields from the gradient coils 1X, 1Y and 1Z. Along with it, the sequence storage circuit 8 operates a gate modulator 9 to modulate a carrier output signal produced from an RF oscillator 10 to a pulsated signal represented in the form of a predetermined timing/predetermined envelope/predetermined phase and adds it to the RF power amplifier 4 as an RF pulse, where it is power-amplified. Thereafter, the RF power amplifier 4 applies the same to the transmitting coil 1T.

The receiving coil 1R is connected to a pre-amplifier 5.

The pre-amplifier 5 amplifies the NMR signal from the subject, which is received by the receiving coil 1R and inputs the same to a phase comparator 12. The phase comparator 12 phase-detects the NMR signal sent from the pre-amplifier 5 in response to a reference signal outputted from the RF oscillator 10 and applies it to an AD converter 11. The AD converter 11 converts the post-phased detection analog signal to digital data and inputs it to the computer 7.

The computer 7 takes charge of the whole control such as the reception of information inputted from an operation console 13. Along with it, the computer 7 reads the digital data from the AD converter 11 and performs arithmetic processing thereon to generate an image and causes a display unit 6 to display the image and a message thereon.

The computer 7 includes a CPU and a memory therein.

Figure 2:
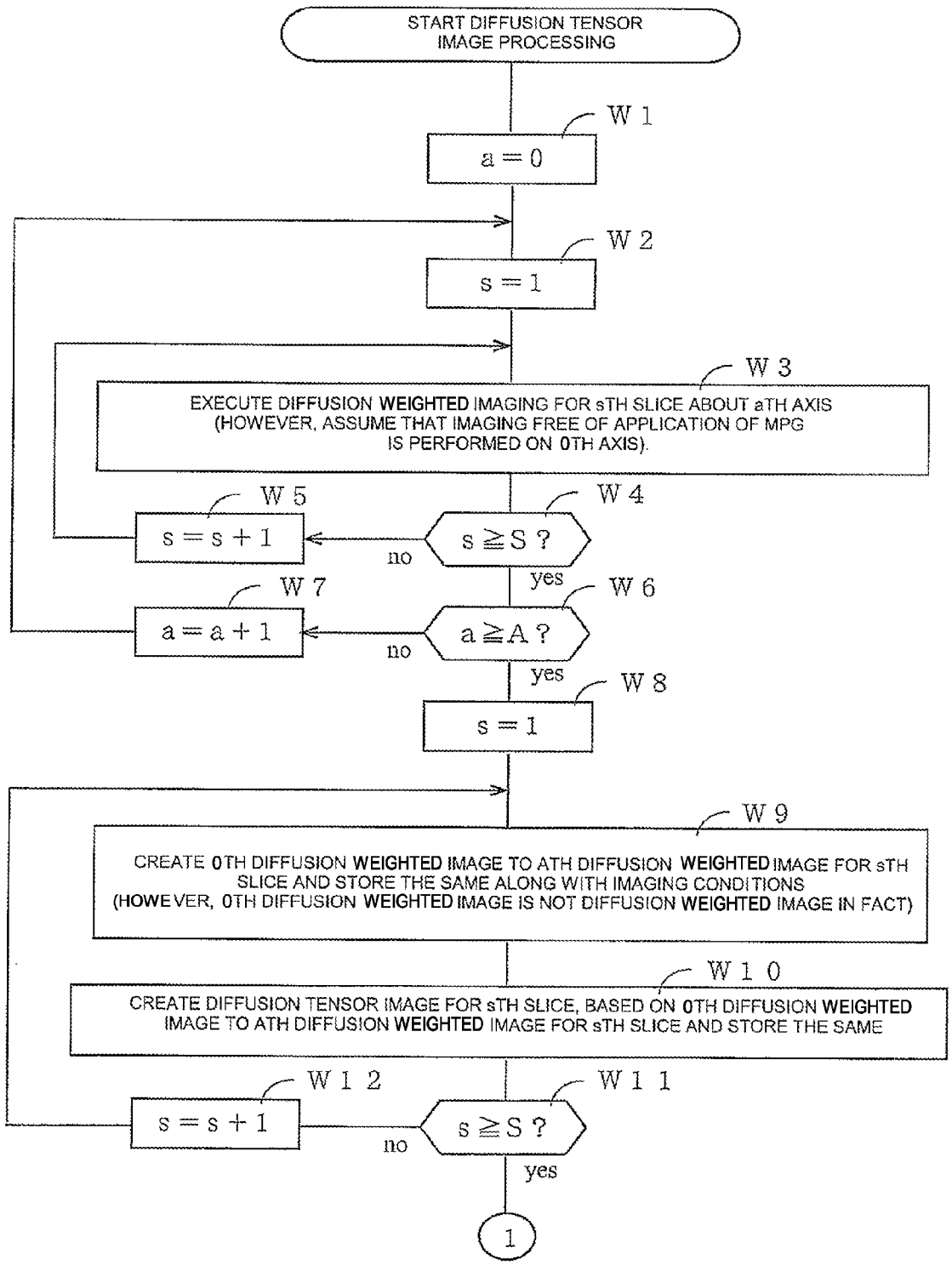
FIG. 2 is a flowchart illustrating a diffusion weighted imaging process according to the first embodiment.

FIG. 2 is a flowchart illustrating a procedure for a diffusion weighted imaging process by the MRI apparatus 100. At Step W1, an axis counter is initialized to a=0.

At Step W2, a slice counter is initialized to s=1.

At Step W3, diffusion weighted imaging for a sth slice is effected on an ath axis. However, photography or imaging free of application of an MPG is carried out upon diffusion weighted imaging about a 0th axis.

At Steps W4 and W5, Step W3 is repeated from a first slice to an S($\geq$1)th slice.

At Steps W6 and W7, Steps W2 to W5 are repeated from the 0th axis to an A($\geq$6)th axis.

At Step W8, the slice counter is initialized to s=1.

At Step W9, an Ath diffusion weighted image is created from a 0th diffusion weighted image for the sth slice and stored together with imaging conditions corresponding to the respective diffusion weighted images. Since, however, the 0th diffusion weighted image is subjected to the imaging free of MPG application, it is not a diffusion weighted image in fact. Thus, an imaging condition corresponding to the 0th diffusion weighted image may not be stored.

At Step W10, a diffusion tensor image for the sth slice is created from the 0th diffusion weighted image for the sth slice, based on the Ath diffusion weighted image and stored.

At Steps W11 and W12, Steps W9 and W10 are repeated from the first slice to the Sth slice. Then, the procedure proceeds to Step W21 of FIG. 3.

Figure 3:
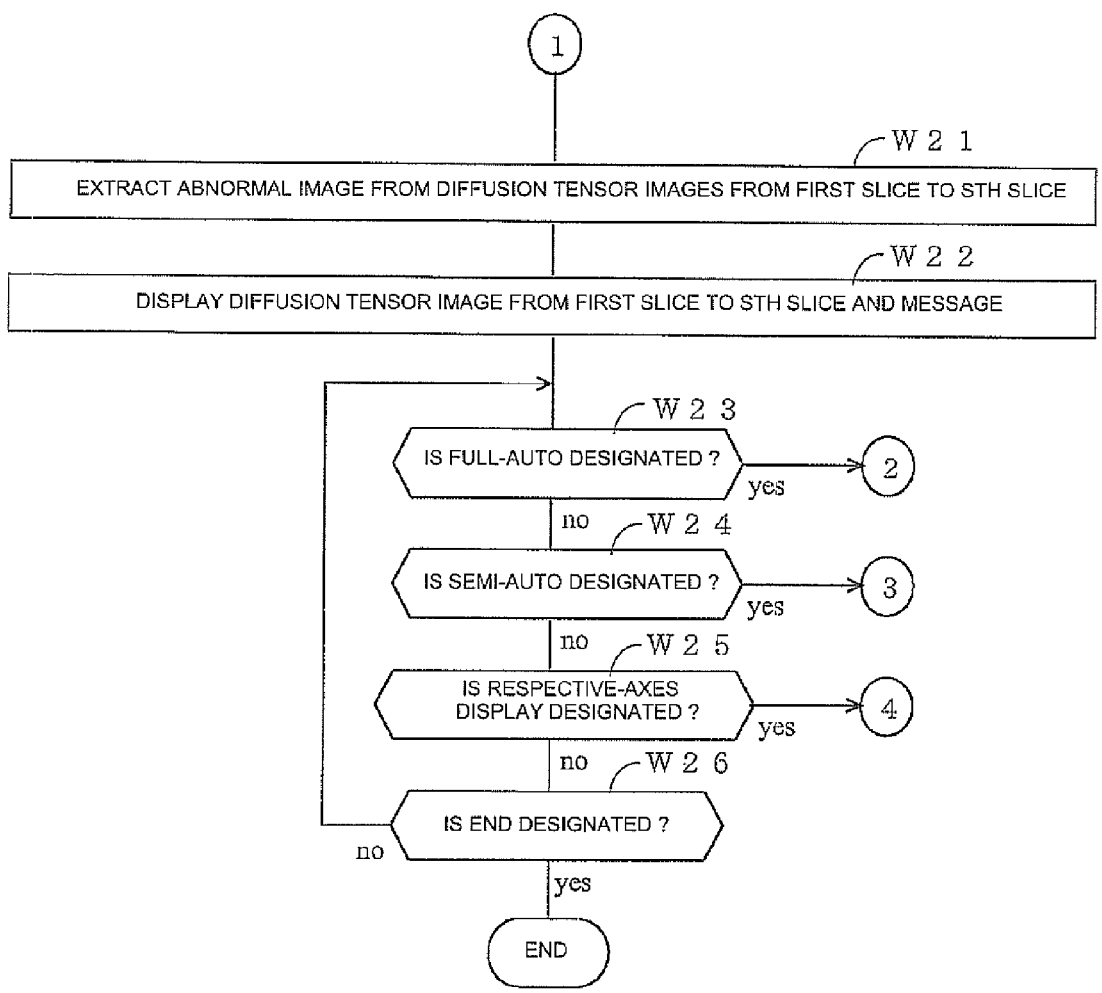
FIG. 3 is a flowchart following FIG. 2.

At Step W21 of FIG. 3, an abnormal image is extracted from the diffusion tensor images from the first slice to the Sth slice. This extracting method calculates, for example, the average of pixel values of the respective diffusion tensor images and determines or regards the image as the abnormal image if it is beyond a predetermined allowable range.

At Step W22, the diffusion tensor images from the first slice to the Sth slice and a message are displayed. A display screen at the time that abnormal images are extracted is illustrated by way of example in FIG. 6.

In the example of FIG. 6, frames are applied to the abnormal images alone and displayed as being distinguishable from others, and a message indicative of such a case is displayed. Further, buttons for "full-auto", "semi-auto", "respective-axes display" and "end" are displayed. When it is desired to leave all to the apparatus and rephotograph, an operator clicks the "full-auto" to select one diffusion tensor image manually. Thereafter, when it is desired to leave to the apparatus that after manual selection of one diffusion tensor image, abnormal images are extracted from diffusion weighted images that become the basis for the diffusion tensor image and rephotograph thereof is done, the operator manually selects one diffusion tensor image and thereafter clicks the "semi-auto". When it is desired to display a diffusion weighted image that becomes the basis for one diffusion tensor image after the manual selection of the one diffusion tensor image, the operator manually selects one diffusion tensor image and thereafter clicks the "respective-axes display". When it is desired to end or terminate the processing, the operator clicks the "end".

Figure 4:
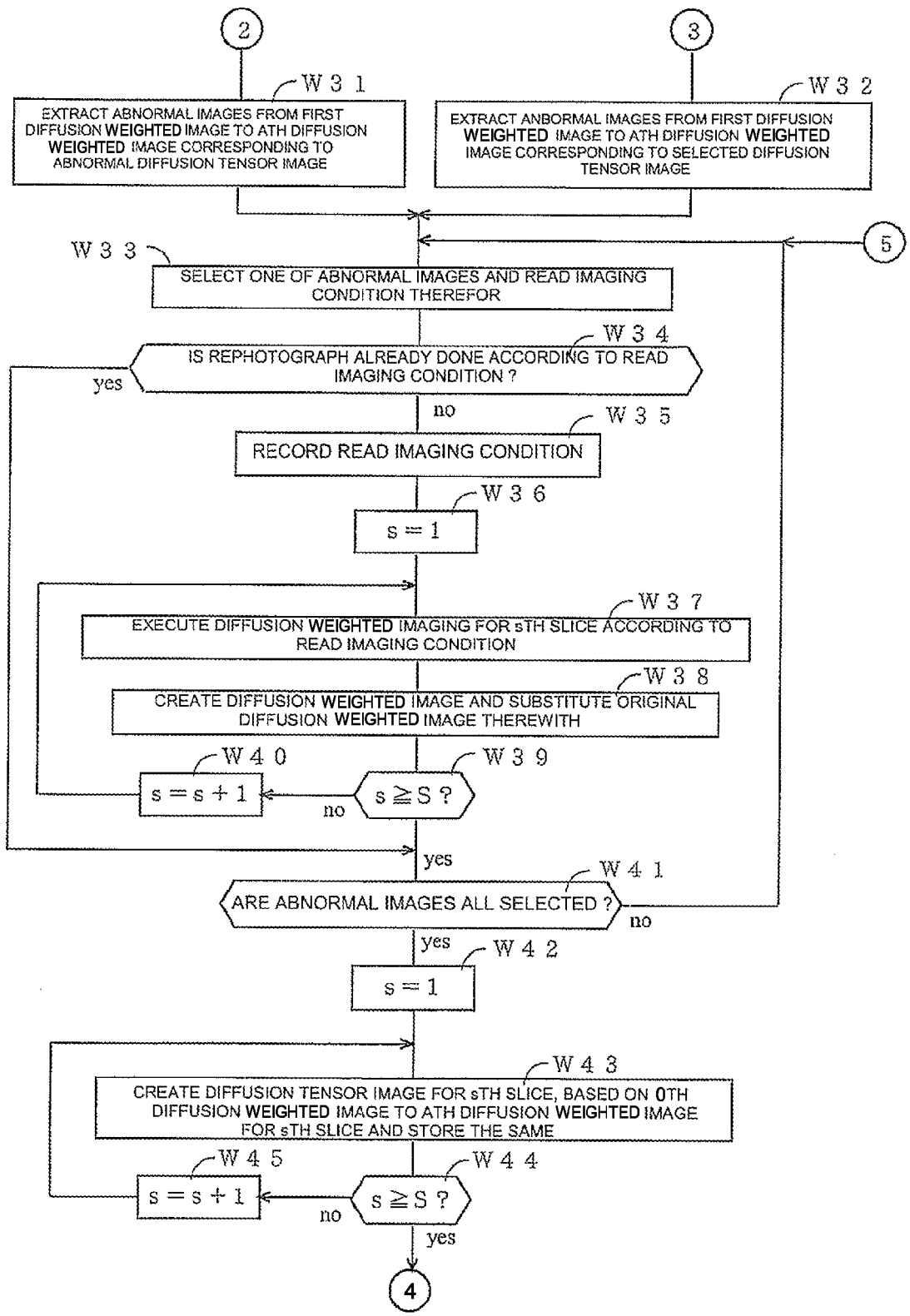
FIG. 4 is a flowchart following FIG. 3.

When the "full-auto" is clicked on the display screen shown in FIG. 6 at Step W23, the procedure proceeds to Step W31 of FIG. 4. If not so, then the procedure proceeds to Step W24.

When one diffusion tensor image is selected and the "semi-auto" is clicked at Step W24 on the display screen shown in FIG. 6, the procedure proceeds to Step W32 of FIG. 4. If not so, then the procedure proceeds to Step W25.

When one diffusion tensor image is selected and the "respective-axes display" is clicked on the display screen shown in FIG. 6 at Step W25, the procedure proceeds to Step W51 of FIG. 5. If not so, then the procedure proceeds to Step W26.

When the "end" is clicked on the display screen shown in FIG. 6 at Step W26, the processing is terminated. If not so, then the procedure returns to Step W23.

At Step W31 of FIG. 4, each abnormal image is extracted from the first diffusion weighted image to the Ath diffusion weighted image, which becomes the basis for each abnormal diffusion tensor image. This extracting method calculates, for example, the average of pixel values of respective diffusion weighted images and determines the image as the abnormal image if it is beyond the predetermined allowable range. Then, the procedure proceeds to Step W33.

At Step W32 of FIG. 4, each abnormal image is extracted from the first diffusion weighted image to the Ath diffusion weighted image, which becomes the basis for each selected diffusion tensor image. This extracting method calculates, for example, the average of pixel values of respective diffusion weighted images and determines the image as the abnormal image if it is beyond the predetermined allowable range. Then, the procedure proceeds to Step W33.

At Step W33, one of abnormal images is selected and an imaging condition therefor is read.

At Step W34, it is confirmed whether rephotograph is done according to the read imaging condition. If it is found that the rephotograph has been done, then the procedure proceeds to Step W41. If not so, then the procedure proceeds to Step W35.

At Step W35, an imaging condition is recorded and the procedure proceeds to Step W36.

At Step W36, the slice counter is initialized to s=1.

At Step W37, diffusion weighted imaging for an sth slice is carried out according to the read imaging condition (including axial information). That is, the rephotograph for the sth slice is effected on the axis of an abnormal image.

At Step W38, a diffusion weighted image for the sth slice about the axis of the abnormal image is created from data obtained by rephotograph, and the original diffusion weighted image is substituted therewith.

At Steps W39 and W40, Steps W37 and W38 are repeated from a first slice to an S(≧1)th slice.

At Step W41, Steps W33 through W40 are repeated with respect to all abnormal images.

At Step W42, the slice counter is initialized to s=1.

At Step W43, a diffusion tensor image for the sth slice is created based on the 0th weighted image to Ath diffusion weighted image for the sth slice and then stored.

At Steps W44 and W45, Step W43 is repeated from the first slice to the Sth slice. Then, the procedure returns to Step W21 of FIG. 3.

At Step W51 of FIG. 5, each abnormal image is extracted from the first diffusion weighted image to the Ath diffusion weighted image, which becomes the basis for the selected diffusion tensor image. This extracting method calculates, for example, the average of pixel values of respective diffusion weighted images and determines the image as the abnormal image if it is beyond the predetermined allowable range.

At Step W52, the first diffusion weighted image to the Ath diffusion weighted image that becomes the basis for the selected diffusion tensor image, and a message are displayed. A display screen at the time that abnormal images are extracted is illustrated by way of example in FIG. 7.

In the example of FIG. 7, frames are applied to the abnormal images alone and displayed as being distinguishable from others. Further, buttons for "auto", "rephotograph", and "return" are displayed. When it is desired to leave all to the apparatus and rephotograph, an operator clicks the "auto" to designate one or more diffusion weighted images manually. Thereafter, when it is desired to rephotograph the axes of the one or more diffusion weighted images, the operator clicks the "rephotograph" after having designated the one or more diffusion weighted images manually. When it is desired to return to the display of the diffusion tensor image, the operator clicks the "return".

At Step W53, the procedure proceeds to Step W33 of FIG. 4 when the "auto" is clicked on the display screen shown in FIG. 7. If not so, then the procedure proceeds to Step W54.

At Step W54, when one or more diffusion weighted images are selected and the "rephotograph" is clicked on the display screen shown in FIG. 7, the procedure proceeds to Step W56. If not so, then the procedure proceeds to Step W55.

At Step W55, the procedure returns to Step W21 of FIG. 3 when the "return" is clicked on the display screen shown in FIG. 7. If not so, then the procedure returns to Step W53.

At Step 56, the designated diffusion weighted image is assumed to be an abnormal image, and the procedure proceeds to Step W33 of FIG. 4.

When it is found at Step W21 of FIG. 3 that no abnormal image is extracted, such a display screen as shown in FIG. 8 is shown in at Step W22.

In the example shown in FIG. 8, a message free of detection of an abnormal image is displayed. Further, buttons for "semi-auto", "respective-axes display" and "end" are displayed. When it is desired to leave to the apparatus that after one diffusion tensor image has been selected manually, an abnormal image is extracted from diffusion weighted images that become the basis for the one diffusion tensor image and rephotograph is effected thereon, the operator clicks the "semi-auto" after the manual selection of the one diffusion tensor image. When it is desired to display the diffusion weighted images that become the basis for the one diffusion tensor image after the manual selection of the one diffusion tensor image, the operator clicks the "respective-axes display" after the manual selection of the one diffusion tensor image. When it is desired to terminate the processing, the operator clicks the "end".

According to the MRI apparatus 100 of the first embodiment, when an abnormal image is found, only the axis of the corresponding abnormal image is rephotographed without redoing diffusion weighted imaging about all axes. Therefore, the diffusion weighted imaging can be redone in a short period of time. It is thus possible to improve detection efficiency.

Second Embodiment

In the first embodiment, the recreation of the diffusion weighted image about the rephotographed axis at Step W38 and the substitution thereof with the original diffusion weighted image have been performed with respect to all slices. On the other hand, however, whether the original diffusion weighted image for the corresponding slice contains an abnormal image or a designated image is determined and the corresponding diffusion weighted image may be replaced only with respect to each slice having contained it.

Further, while the recreation of the diffusion tensor image at Step W43 and the substitution thereof with the original diffusion tensor image have been performed with respect to all slices, whether the diffusion tensor image for the corresponding slice is an abnormal image or a selected image is determined and the corresponding diffusion tensor image may be created and replaced only in such a case.

Upon replacement of the created diffusion weighted image+diffusion tensor image, the original image and a newly-created image are displayed and the execution of its replacement may be decided manually.

Many widely different embodiments of the present invention may be configured without departing from the spirit and the scope of the present invention. It should be understood that the present invention is not limited to the specific embodiments described in the specification, except as defined in the appended claims.

The invention claimed is:

1. A magnetic resonance imaging (MRI) apparatus comprising:
   an image display device configured to display a plurality of diffusion weighted images of respective axes corresponding to one slice;
   a designation operating device configured to enable an operator to designate each diffusion weighted image targeted for rephotograph from the displayed diffusion weighted images;
   a diffusion weighted imaging device configured to rephotograph only the axis of each diffusion weighted image designated by the operator to generate a rephotographed diffusion weighted image;
   a diffusion weighted image substituting device configured to generate a set of post-substitution diffusion weighted images by substituting each designated diffusion weighted image with each rephotographed diffusion weighted image; and
   a diffusion tensor image creating device configured to create a diffusion tensor image from the set of post-substitution diffusion weighted images.

2. The MRI apparatus according to claim 1, further comprising an abnormal image extracting device configured to extract an abnormal image from the diffusion weighted images of the respective axes corresponding to the one slice, and a warning device configured to present a notification to the operator of a presence of the abnormal image.

3. The MRI apparatus according to claim 2, wherein the abnormal image extracting device is configured to extract the abnormal image based on an average of pixel values of the plurality of diffusion weighted images.

4. The MRI apparatus according to claim 1, further comprising an imaging condition storing device configured to store at least one imaging condition for the diffusion weighted images of the respective axes therein,
   wherein the diffusion weighted imaging device roads an is configured to read the at least one imaging condition for each diffusion weighted image designated by the operator and to perform the rephotograph under the read imaging condition.

5. A magnetic resonance imaging (MRI) apparatus comprising:
   an abnormal image extracting device configured to extract an abnormal image from diffusion weighted images of respective axes corresponding to one slice;
   a diffusion weighted imaging device configured to rephotograph only the axis of the extracted diffusion weighted image to generate a rephotographed diffusion weighted image;
   a diffusion weighted image substituting device configured to generate a post-substitution diffusion weighted image by substituting the extracted diffusion weighted image with each the rephotographed diffusion weighted image; and
   a diffusion tensor image creating device configured to create a diffusion tensor image from the post-substitution diffusion weighted image.

6. The MRI apparatus according to claim 5, wherein the abnormal image extracting device is configured to extract the abnormal image, based on an average of pixel values of the plurality of diffusion weighted images.

7. The MRI apparatus according to claim 5, further comprising an imaging condition storing device configured to store at least one imaging condition for the diffusion weighted images of the respective axes therein,
   wherein the diffusion weighted imaging device is configured to read the at least one imaging condition for each diffusion weighted image designated by the operator and to perform the rephotograph under the read imaging condition.

8. A magnetic resonance imaging (MRI) apparatus comprising:
   a selection operating device configured to enable an operator to select a diffusion tensor image targeted for rephotograph from a plurality of diffusion tensor images of one or more slices;
   an image display device configured to display a plurality of diffusion weighted images of respective axes corresponding to the selected diffusion tensor image;
   a designation operating device configured to enable the operator to designate a diffusion weighted image targeted for rephotograph from the displayed diffusion weighted images of axes;
   a diffusion weighted imaging device configured to rephotograph only the axis of the diffusion weighted image designated by the operator to generate a rephotographed diffusion weighted image;
   a diffusion weighted image substituting device configured to generate a post-substitution diffusion weighted image by substituting the designated diffusion weighted image with the rephotographed diffusion weighted image;
   a diffusion tensor image creating device configured to create a substitute diffusion tensor image from the post-substitution diffusion weighted image; and
   a diffusion tensor image substituting device configured to substitute the selected diffusion tensor image with the substitute diffusion tensor image.

9. The MRI apparatus according to claim 8, further comprising an abnormal image extracting device configured to extract an abnormal diffusion tensor image from the plurality of diffusion tensor images of the one or more slices, and a warning device configured to present a notification to the operator of a presence of the abnormal diffusion tensor image.

10. The MRI apparatus according to claim 9, wherein the abnormal image extracting device is configured to extract the abnormal diffusion tensor image based on an average of pixel values of the plurality of diffusion tensor images.

11. The MRI apparatus according to claim 9, wherein the abnormal image extracting device is further configured to extract an abnormal diffusion weighted image from the plurality of diffusion weighted images of the respective axes corresponding to the diffusion tensor image selected by the operator, and the warning device is further configured to present a notification to the operator of a presence of the abnormal diffusion weighted image.

12. The MRI apparatus according to claim 11, wherein the abnormal image extracting device is configured to extract the abnormal diffusion weighted image, based on an average of pixel values of the plurality of diffusion weighted images.

13. The MRI apparatus according to claim 8, further comprising an imaging condition storing device configured to store at least one imaging condition for the plurality of diffusion weighted images of the respective axes therein, wherein the diffusion weighted imaging device is configured to read the at least one imaging condition for each diffusion weighted image designated by the operator and to perform the rephotograph under the read imaging condition.

14. An MRI apparatus comprising:
a selection operating device configured to enable an operator to select a diffusion tensor image targeted for rephotograph from a plurality of diffusion tensor images of one or more slices;
an abnormal image extracting device configured to extract an abnormal diffusion weighted image from a plurality of diffusion weighted images of respective axes corresponding to the diffusion tensor image selected by the operator;
a diffusion weighted imaging device configured to rephotograph only the axis of the extracted diffusion weighted image to generate a rephotographed diffusion weighted image;
a diffusion weighted image substituting device configured to generate a post-substitution diffusion weighted image by substituting the extracted diffusion weighted image with the rephotographed diffusion weighted image;
a diffusion tensor image creating device configured to create a substitute diffusion tensor image from the post-substitution diffusion weighted image; and
a diffusion tensor image substituting device configured to substitute the selected diffusion tensor image with the substitute diffusion tensor image.

15. The MRI apparatus according to claim 14, wherein the abnormal image extracting device is configured to extract the abnormal diffusion weighted image, based on an average of pixel values of the plurality of diffusion weighted images.

16. The MRI apparatus according to claim 14, further comprising an imaging condition storing device configured to store at least one imaging condition for the plurality of diffusion weighted images of the respective axes therein,
wherein the diffusion weighted imaging device is configured to read the at least one imaging condition for each diffusion weighted image designated by the operator and to perform the rephotograph under the read imaging condition.

17. An MRI apparatus comprising:
an abnormal image extracting device configured to extract an abnormal diffusion tensor image from a plurality of diffusion tensor images of one or more slices and to extract an abnormal diffusion weighted image from a plurality of diffusion weighted images of respective axes corresponding to the extracted abnormal diffusion tensor image;
a diffusion weighted imaging device configured to rephotograph only the axis of the extracted diffusion weighted image to generate a rephotographed diffusion weighted image;
a diffusion weighted image substituting device configured to generate a post-substitute diffusion weighted image by substituting the extracted diffusion weighted image with the rephotographed diffusion weighted image;
a diffusion tensor image creating device configured to create a substitute diffusion tensor image from the post-substitution diffusion weighted image; and
a diffusion tensor image substituting device configured to substitute the selected diffusion tensor image with the substitute diffusion tensor image.

18. The MRI apparatus according to claim 17, wherein the abnormal image extracting device is configured to extract the abnormal diffusion tensor image, based on an average of pixel values of the plurality of diffusion tensor images and to extract the abnormal diffusion weighted image based on an average of pixel values of the plurality of diffusion weighted images.

19. The MRI apparatus according to claim 17, further comprising an imaging condition storing device configured to store at least one imaging condition for the plurality of diffusion weighted images of the respective axes therein,
wherein the diffusion weighted imaging device is configured to read the at least one imaging condition for each diffusion weighted image designated by the operator and to perform the rephotograph under the read imaging condition.

20. The MRI apparatus according to claim 17, wherein the diffusion weighted image substituting device is configured to generate a set of post-substitute diffusion weighted images that includes the rephotographed diffusion weighted image and the remaining diffusion weighted images of the plurality of diffusion weighted images corresponding to the extracted abnormal diffusion tensor image, and
wherein the diffusion tensor image creating device is configured to create the substitute diffusion tensor image from the set of post-substitution diffusion weighted images.

* * * * *